US009809489B2

(12) United States Patent
Shimoda et al.

(10) Patent No.: US 9,809,489 B2
(45) Date of Patent: Nov. 7, 2017

(54) COMPOSITION FOR FORMING A CONDUCTIVE FILM, A CONDUCTIVE FILM, A METHOD FOR PRODUCING A PLATING FILM, A PLATING FILM, AND AN ELECTRONIC DEVICE

(71) Applicant: JSR Corporation, Minato-ku (JP)

(72) Inventors: Sugirou Shimoda, Tokyo (JP); Kenzou Ookita, Tokyo (JP); Keisuke Satou, Tokyo (JP); Kazuto Watanabe, Tokyo (JP)

(73) Assignee: JSR Corporation, Minato-ku (JP)

( * ) Notice: Subject to any disclaimer, the term of this patent is extended or adjusted under 35 U.S.C. 154(b) by 0 days.

(21) Appl. No.: 14/849,960

(22) Filed: Sep. 10, 2015

(65) Prior Publication Data
US 2016/0081189 A1     Mar. 17, 2016

(30) Foreign Application Priority Data

Sep. 12, 2014 (JP) ............................... 2014-187108
Jun. 11, 2015 (JP) ............................... 2015-118320

(51) Int. Cl.
*H01B 1/02* (2006.01)
*C03C 17/10* (2006.01)
(Continued)

(52) U.S. Cl.
CPC ............ *C03C 17/10* (2013.01); *G06F 3/044* (2013.01); *H01B 1/02* (2013.01); *H05K 1/097* (2013.01);
(Continued)

(58) Field of Classification Search
CPC ............ C03C 17/10; C03C 2217/256; C03C 2217/27; C03C 2217/70; C03C 2217/253;
(Continued)

(56) References Cited

U.S. PATENT DOCUMENTS 5,068,150 A * 11/1991 Nakamura ............... C08K 9/04
                                                    252/500
2003/0029193 A1 * 2/2003 Feng ....................... B01J 31/22
                                                    65/17.2
(Continued)

FOREIGN PATENT DOCUMENTS

JP       2004-162110        6/2004
JP        2005-2471         1/2005
(Continued)

OTHER PUBLICATIONS

Alger, M. "Polymetalloxane," Polymer Science Dictionary, $2^{nd}$ ed. (1997).*

Primary Examiner — Mark Kopec
Assistant Examiner — Jaison Thomas
(74) Attorney, Agent, or Firm — Oblon, McClelland, Maier & Neustadt, L.L.P.

(57) ABSTRACT

A composition for forming a conductive film includes at least one of a metal salt (A1) and a metal particle (A2) as component (A) that serves as a metal source of the conductive film, and a metalloxane compound (B). The metal salt (A1) and the metal particle (A2) contain one or more metals selected from the group consisting of Ni, Pd, Pt, Cu, Ag, and Au. The metalloxane compound (B) has at least one metal atom selected from the group consisting of Ti, Zr, Sn, Si, and Al in its main chain. Preferably, the metal salt (A1) is a carboxylate containing a metal selected from the group consisting of Cu, Ag, and Ni. Preferably, the metal particle (A2) has an average particle diameter of 5 nm to 100 nm and comprises a metal selected from the group consisting of Cu, Ag, and Ni.

7 Claims, 2 Drawing Sheets

(51) Int. Cl.
*H05K 1/09* (2006.01)
*H05K 3/18* (2006.01)
*G06F 3/044* (2006.01)
*G06F 3/041* (2006.01)
*H05K 1/03* (2006.01)
*H05K 3/38* (2006.01)

(52) U.S. Cl.
CPC ....... *H05K 3/188* (2013.01); *C03C 2217/253* (2013.01); *C03C 2217/256* (2013.01); *C03C 2217/27* (2013.01); *C03C 2218/365* (2013.01); *G06F 3/041* (2013.01); *G06F 2203/04111* (2013.01); *H05K 1/0306* (2013.01); *H05K 1/0386* (2013.01); *H05K 3/38* (2013.01); *H05K 2203/1157* (2013.01); *H05K 2203/125* (2013.01)

(58) Field of Classification Search
CPC ........... G06F 3/044; G06F 2203/04111; G06F 3/041; H05K 1/097; H05K 3/188; H05K 2203/1157; H05K 2203/125; H05K 3/38; H05K 1/0386; H05K 1/0306; H01B 1/02
See application file for complete search history.

(56) References Cited

U.S. PATENT DOCUMENTS

| | | | |
|---|---|---|---|
| 2004/0197254 A1* | 10/2004 | Toki | C08F 291/00 423/267 |
| 2004/0249063 A1 | 12/2004 | Sterzel et al. | |
| 2012/0142836 A1* | 6/2012 | Matsumoto | C01B 31/02 524/176 |
| 2015/0034368 A1* | 2/2015 | Yang | H05K 1/097 174/253 |
| 2015/0101849 A1* | 4/2015 | Bockmeyer | C03C 17/007 174/257 |

FOREIGN PATENT DOCUMENTS

| | | |
|---|---|---|
| JP | 2008-13466 | 1/2008 |
| JP | 2008-31104 | 2/2008 |
| JP | 2010-242118 | 10/2010 |
| JP | 2011-34749 | 2/2011 |
| JP | 2011-34750 | 2/2011 |

\* cited by examiner

*FIG. 1*

Y-direction
X-direction
31

FIG. 2

COMPOSITION FOR FORMING A CONDUCTIVE FILM, A CONDUCTIVE FILM, A METHOD FOR PRODUCING A PLATING FILM, A PLATING FILM, AND AN ELECTRONIC DEVICE

CROSS-REFERENCE TO THE RELATED APPLICATION

The entire disclosure of the Japanese Patent Application No. 2014-187108 filed on Sep. 12, 2014 and 2015-118320 filed on Jun. 11, 2015 including specification, claims, drawings, and summary, on which the Convention priority of the present application is based, are incorporated herein in its entirety.

FIELD OF THE INVENTION

The present invention relates to a composition for forming a conductive film, a conductive film, a method for producing a plating film, a plating film, and an electronic device.

In the field of electronic devices having semiconductor elements, such as a computing element, a piezoelectric element, and a liquid crystal display element; and organic EL elements, wiring boards are the main parts for having electronic components attached thereto. A wiring board is also referred to as a printed wiring board, or the like. Usually, wiring of such a wiring board is formed by forming a seed layer (conductive film) and then performing a plating procedure.

As a composition for forming such a conductive film, there is a known composition including a metal particulate and/or a metal salt as a metal source of a conductive film.

Specifically, according to the technologies disclosed in JP 2008-13466 A and JP 2008-31104 A, the production of a fine copper particle is achieved by combining copper formate and an amine.

Further, according to the technologies disclosed in JP 2004-162110 A, the formation of a copper film is achieved by the composition formed by combining copper salt and amine. According to the technologies disclosed in JP 2005-2471 A, the formation of a copper film is achieved by the composition formed by combining copper formate and amine. According to the technologies disclosed in JP 2010-242118 A, the formation of a copper film is achieved by the composition formed by combining copper formate and alkanolamineamine.

Furthermore, according to the technologies disclosed in JP 2011-34749 A and JP 2011-34750 A, the formation of a copper film is achieved by the composition including a noble metal particulate, a copper salt, reductant, and monoamine.

Compositions including a metal particulate and a metal salt for forming a conductive film have been extensively investigated. However, each technology has problems which would be desirable to overcome.

Specifically, in the case of a technology for forming a conductive film using a composition containing a metal particulate, it was difficult to completely fuse the metal particle by simple sintering at low temperature. Therefore, as compared with bulk metal, a conductive film obtained after sintering had a problem in that an improvement in electric resistance properties cannot be achieved. That is, a conductive film obtained after sintering had a problem that reduction in resistance (reduction in electric resistance) cannot be achieved.

Moreover, a technology of a dispersion composition using the above described metal particulate and a technology of a composition using a metal salt had a problem in that sufficient adhesion between a conductive film and a substrate cannot be obtained when the conductive film is formed on the substrate.

For example, in a touch panel, a conductive film on a substrate is pushed by the user's touch operation and the substrate may become deformed. Therefore, a conductive film to form a pattern of wiring or the like is required to have high adhesion to a substrate so as not to peel off due to such an external influence.

However, conventional technologies were difficult to achieve a conductive film having low resistance and superior adhesion to a substrate.

An object of the present invention is to provide a composition for forming a conductive film having low resistance and superior adhesion to a substrate, a conductive film, a method for producing a plating film, a plating film, and an electronic device.

The present inventors researched earnestly in order to solve the above-mentioned problems. As a result, they found that the above problems can be solved by a composition for forming a conductive film, a conductive film, a method for producing a plating film, a plating film, and an electronic device, and thus they have accomplished the present invention.

SUMMARY OF THE INVENTION

According to one aspect of the present invention, a composition for forming a conductive film includes at least one of a metal salt (A1) and a metal particle (A2) as component (A) that serves as a metal source of the conductive film, and a metalloxane compound (B). The metal salt (A1) and metal particle (A2) contain one or more metals selected from the group consisting of Ni, Pd, Pt, Cu, Ag, and Au as component that serves as a metal source of the conductive film. The metalloxane compound (B) has at least one metal atom selected from the group consisting of Ti, Zr, Sn, Si, and Al in its main chain.

According to another aspect of the present invention, a composition for forming a conductive film includes at least one of a metal salt (A1) and a metal particle (A2) as component (A) that serves as a metal source of the conductive film, and a metalloxane compound (B). The metal salt (A1) and metal particle (A2) contain one or more metals selected from the group consisting of Ni, Pd, Pt, Cu, Ag, and Au as component that serves as a metal source of the conductive film. The metalloxane compound (B) has at least one metal atom selected from the group consisting of Ti, Zr, Sn, Si, and Al in its main chain. The metal salt (A1) is a carboxylate containing a metal selected from the group consisting of Cu, Ag, and Ni.

According to another aspect of the present invention, a composition for forming a conductive film includes at least one of a metal salt (A1) and a metal particle (A2) as component (A) that serves as a metal source of the conductive film, and a metalloxane compound (B). The metal salt (A1) and metal particle (A2) contain one or more metals selected from the group consisting of Ni, Pd, Pt, Cu, Ag, and Au as component that serves as a metal source of the conductive film. The metalloxane compound (B) has at least one metal atom selected from the group consisting of Ti, Zr, Sn, Si, and Al in its main chain. The metal salt (A1) is a carboxylate containing a metal selected from the group consisting of Cu, Ag, and Ni. The carboxylate is at least one selected from the group consisting of copper formate, silver formate, and nickel formate.

According to another aspect of the present invention, a composition for forming a conductive film includes at least one of a metal salt (A1) and a metal particle (A2) as component (A) that serves as a metal source of the conductive film, and a metalloxane compound (B). The metal salt (A1) and metal particle (A2) contain one or more metals selected from the group consisting of Ni, Pd, Pt, Cu, Ag, and Au as component that serves as a metal source of the conductive film. The metal particle (A2) has an average particle diameter of 5 nm to 100 nm and comprises a metal selected from the group consisting of Cu, Ag, and Ni. The metalloxane compound (B) has at least one metal atom selected from the group consisting of Ti, Zr, Sn, Si, and Al in its main chain.

According to another aspect of the present invention, a composition for forming a conductive film includes at least one of a metal salt (A1) and a metal particle (A2) as component (A) that serves as a metal source of the conductive film, and a metalloxane compound (B). The metal salt (A1) and metal particle (A2) contain one or more metals selected from the group consisting of Ni, Pd, Pt, Cu, Ag, and Au as component that serves as a metal source of the conductive film. The metalloxane compound (B) has at least one metal atom selected from the group consisting of Ti, Zr, Sn, Si, and Al in its main chain. The content of the metalloxane compound (B) is 20% by mass to 80% by mass relative to 100% by mass in total of the masses of the metal salt (A1) and metal particle (A2) and the metalloxane compound (B).

According to another aspect of the present invention, a composition for forming a conductive film includes at least one of a metal salt (A1) and a metal particle (A2) as component (A) that serves as a metal source of the conductive film, a metalloxane compound (B), and an amine compound (C). The metal salt (A1) and metal particle (A2) contain one or more metals selected from the group consisting of Ni, Pd, Pt, Cu, Ag, and Au as component that serves as a metal source of the conductive film. The metalloxane compound (B) has at least one metal atom selected from the group consisting of Ti, Zr, Sn, Si, and Al in its main chain.

According to another aspect of the present invention, a conductive film is formed using a composition including at least one of a metal salt (A1) and a metal particle (A2) as component (A) that serves as a metal source of the conductive film, and a metalloxane compound (B). The metal salt (A1) and metal particle (A2) contain one or more metals selected from the group consisting of Ni, Pd, Pt, Cu, Ag, and Au as component that serves as a metal source of the conductive film. The metalloxane compound (B) has at least one metal atom selected from the group consisting of Ti, Zr, Sn, Si, and Al in its main chain.

According to another aspect of the present invention, a conductive film is formed using a composition including at least one of a metal salt (A1) and a metal particle (A2) as component (A) that serves as a metal source of the conductive film, and a metalloxane compound (B). The metal salt (A1) and metal particle (A2) contain one or more metals selected from the group consisting of Ni, Pd, Pt, Cu, Ag, and Au as component that serves as a metal source of the conductive film. The metal salt (A1) is a carboxylate containing a metal selected from the group consisting of Cu, Ag, and Ni. The metalloxane compound (B) has at least one metal atom selected from the group consisting of Ti, Zr, Sn, Si, and Al in its main chain.

According to another aspect of the present invention, a conductive film is formed using a composition including at least one of a metal salt (A1) and a metal particle (A2) as component (A) that serves as a metal source of the conductive film, and a metalloxane compound (B). The metal salt (A1) and metal particle (A2) contain one or more metals selected from the group consisting of Ni, Pd, Pt, Cu, Ag, and Au as component that serves as a metal source of the conductive film. The metal salt (A1) is a carboxylate containing a metal selected from the group consisting of Cu, Ag, and Ni. The carboxylate is at least one selected from the group consisting of copper formate, silver formate, and nickel formate. The metalloxane compound (B) has at least one metal atom selected from the group consisting of Ti, Zr, Sn, Si, and Al in its main chain.

According to another aspect of the present invention, a method for producing a plating film includes forming a conductive film using a composition which includes at least one of a metal salt (A1) and a metal particle (A2) as component (A) that serves as a metal source of the conductive film, and a metalloxane compound (B). The metal salt (A1) and metal particle (A2) contain one or more metals selected from the group consisting of Ni, Pd, Pt, Cu, Ag, and Au as component that serves as a metal source of the conductive film. The metalloxane compound (B) has at least one metal atom selected from the group consisting of Ti, Zr, Sn, Si, and Al in its main chain. A plating film is produced by plating the conductive film.

According to another aspect of the present invention, a method for producing a plating film includes forming a conductive film using a composition which includes at least one of a metal salt (A1) and a metal particle (A2) as component (A) that serves as a metal source of the conductive film, and a metalloxane compound (B). The metal salt (A1) and metal particle (A2) contain one or more metals selected from the group consisting of Ni, Pd, Pt, Cu, Ag, and Au as component that serves as a metal source of the conductive film. The metal salt (A1) is a carboxylate containing a metal selected from the group consisting of Cu, Ag, and Ni. The metalloxane compound (B) has at least one metal atom selected from the group consisting of Ti, Zr, Sn, Si, and Al in its main chain. A plating film is produced by plating the conductive film.

According to another aspect of the present invention, a method for producing a plating film includes forming a conductive film using a composition which includes at least one of a metal salt (A1) and a metal particle (A2) as component (A) that serves as a metal source of the conductive film, and a metalloxane compound (B). The metal salt (A1) and metal particle (A2) contain one or more metals selected from the group consisting of Ni, Pd, Pt, Cu, Ag, and Au as component that serves as a metal source of the conductive film. The metal salt (A1) is a carboxylate containing a metal selected from the group consisting of Cu, Ag, and Ni. The carboxylate is at least one selected from the group consisting of copper formate, silver formate, and nickel formate. The metalloxane compound (B) has at least one metal atom selected from the group consisting of Ti, Zr, Sn, Si, and Al in its main chain. A plating film is produced by plating the conductive film.

According to another aspect of the present invention, a plating film is produced by plating a conductive film. The conductive film is formed using a composition including at least one of a metal salt (A1) and a metal particle (A2) as component (A) that serves as a metal source of the conductive film, and a metalloxane compound (B). The metal salt (A1) and metal particle (A2) contain one or more metals selected from the group consisting of Ni, Pd, Pt, Cu, Ag, and Au as component that serves as a metal source of the conductive film. The metalloxane compound (B) has at least one metal atom selected from the group consisting of Ti, Zr, Sn, Si, and Al in its main chain.

According to another aspect of the present invention, an electronic device includes a wiring board including a plating film. The plating film is produced by plating a conductive film. The conductive film is formed using a composition including at least one of a metal salt (A1) and a metal particle (A2) as component (A) that serves as a metal source of the conductive film, and a metalloxane compound (B). The metal salt (A1) and metal particle (A2) contain one or more metals selected from the group consisting of Ni, Pd, Pt, Cu, Ag, and Au as component that serves as a metal source of the conductive film. The metalloxane compound (B) has at least one metal atom selected from the group consisting of Ti, Zr, Sn, Si, and Al in its main chain.

DETAILED DESCRIPTION OF THE EMBODIMENT

The composition for forming a conductive film of the present invention does not need hydrogen gas, which has heretofore been used frequently, during heating treatment of a coating film for forming a conductive film. An environment excluding oxidative atmospheres such as the air is herein defined as a non-oxidative atmosphere. The composition for forming a conductive film of an embodiment of the present invention can form a conductive film with desired resistance properties by heating even under a non-oxidative atmosphere. For example, by heating a coating film under an atmosphere using nitrogen gas, argon gas, helium gas, or the like, it is possible to form conductive film having excellent adhesion to a substrate and low resistance. Moreover, the composition for forming a conductive film of an embodiment of the present invention can form, by being heated, a conductive film having excellent adhesion to a substrate and low resistance even under an oxidative atmosphere, such as the air.

The composition for forming a conductive film of the present invention can form a uniform solid conductive film on a substrate. When the composition for forming a conductive film of the present invention is combined with an appropriate coating method, a patterned conductive film for constituting a wire, an electrode, a terminal, and the like, can be formed directly on a substrate. In the present invention, "conductive film" is a concept including patterned conductive films as well as solid films made of conductive materials such as metal and the like. That is, patterns of metal wiring and metal electrodes are also included in the "conductive film" of the present invention. Likewise, "film" may also be used as a concept including a pattern.

In the present invention, "wiring board" is not necessarily limited only to wiring boards known as printed wiring boards. In the present invention, the "wiring board" includes all substrates on which a patterned conductive film has been formed and which constitute wires, electrodes, terminals, and the like. For example, in the present invention, the "wiring board" includes, in addition to the above-described printed wiring board, substrates for constituting semiconductor elements, such as a piezoelectric element and a liquid crystal display element, an organic EL element, etc. That is, the "wiring board" includes, in addition to printed wiring boards, substrates for constituting a piezoelectric element, and the like on which a patterned conductive film has been formed and which constitute wires, electrodes, terminals, and the like.

For convenience, electrically conductive members such as a wire, electrode, terminal, etc. are collectively referred to as "wires" in the following description.

Composition for Forming a Conductive Film

The composition for forming a conductive film of one embodiment of the present invention is a composition including:

at least one of a metal salt (A1) and a metal particle (A2) containing one or more metals selected from the group consisting of Ni (nickel), Pd (palladium), Pt (platinum), Cu (copper), Ag (silver), and Au (gold) as component (A) that serves as a metal source of the conductive film, and a metalloxane compound (B) having at least one metal atom selected from the group consisting of Ti (titanium), Zr (zirconium), Sn (tin), Si (silicon), and Al (aluminum) in its main chain, and is a reduction reaction type composition for forming a conductive film.

In addition to each above-mentioned component, the composition for forming a conductive film of the present invention may include (C) an amine compound, a solvent, and so on in addition to the aforementioned components.

Hereinafter, each of the components of the composition for forming a conductive film of this embodiment is explained.

Component (A)

The composition for forming a conductive film of an embodiment of the present invention includes as component (A) at least one of a metal salt (A1) and a metal particle (A2) containing one or more metals selected from the group consisting of Ni, Pd, Pt, Cu, Ag, and Au that serves as a source of a conductive film. Of these, a metal salt (A1) is preferred because a conductive film that has low resistance and excellent adhesion to a substrate can be formed.

Preferably, the component (A) is at least one of a metal salt and a metal particle containing one or more metals selected from the group consisting of Cu, Ag, and Ni from the perspective of forming a conductive film with low resistance in a lower cost.

Metal Salt (A1)

The above-mentioned metal salt (A1) is a metal salt composed of a metal ion and at least one of an inorganic anion and an organic anion.

Examples of the metal salt (A1) containing copper include copper carboxylate including copper salts with aliphatic carboxylic acids, such as copper acetate, copper trifluoroacetate, copper propionate, copper butyrate, copper isobutyrate, copper 2-methylbutyrate, copper 2-ethylbutyrate, copper valerate, copper isovalerate, copper pivalate, copper hexanoate, copper heptanoate, copper octanoate, copper 2-ethylhexanoate, and copper nonanoate, copper salts with dicarboxylic acids, such as copper malonate, copper succinate, and copper maleate, copper salts with aromatic carboxylic acids, such as copper benzoate and copper salicylate, copper salts with carboxylic acids having reducing power, such as copper formate, copper hydroxyacetate, copper glyoxylate, copper lactate, copper oxalate, copper tartarate, copper malate, and copper citrate, and hydrates of the copper salts listed above; and complex salts in which one molecule or two molecules of an acetylacetone derivative or an acetoacetic ester derivative have complexed per copper atom including acetylacetonato copper, ethyl acetoacetate copper, 1,1,1-trimethylacetylacetonato copper, 1,1,1,5,5,5-hexamethylacetylacetonato copper, 1,1,1-trifluoroacetylacetonato copper, and 1,1,1,5,5,5-hexafluoroacetylacetonato copper.

Among these, from the viewpoint of solubility and from the perspective of forming a conductive film having low electrical resistance, examples of a preferred metal salt (A1) containing copper include copper acetate, copper trifluoroacetate, copper propionate, copper butyrate, copper isobutyrate, copper 2-methylbutyrate, copper pivalate, copper formate, copper hydroxyacetate, copper glyoxylate, copper oxalate, acetylacetonato copper, ethyl acetoacetate copper, 1,1,1-trifluoroacetylacetonato copper, 1,1,1,5,5,5-hexafluoroacetylacetonato copper, and hydrates thereof. Moreover, copper formate and copper formate hydrate can be listed as particularly preferred metal salt (A1) containing copper.

Examples of the metal salt (A1) containing silver include silver carboxylate including silver acetate, silver formate, silver benzoate, silver citrate, silver lactate, silver trifluoroacetate, silver oxalate; and silver nitrate, silver oxide, acetylacetone silver, ethyl acetoacetate silver, silver bromate, silver bromide, silver carbonate, silver chloride, silver fluoride, silver iodate, silver iodide, silver nitrite, silver perchlorate, silver phosphate, silver sulfate, and silver sulfide.

Among these, from the perspective of forming a conductive film having low electrical resistance, examples of a preferred metal salt (A1) containing silver include silver carboxylate. Moreover, silver acetate, silver formate and silver oxalate can be listed as more preferred metal salt (A1) containing silver and silver formate can be listed as particularly preferred metal salt (A1) containing silver.

Examples of the metal salt (A1) containing nickel include nickel carboxylate including nickel acetate, nickel formate, and nickel oxalate. Among these, Nickel formate can be listed as a particularly preferred metal salt (A1) containing nickel from the perspective of forming a conductive film having low electrical resistance.

The purity of the metal salt (A1) is usually 90% or more, preferably 95% or more. The metal salt (A1) may be used singly or as a mixture of two or more.

In the composition for forming a conductive film of the present invention, the content of the metal salt (A1) is usually 1% by mass to 70% by mass, preferably 5% by mass to 50% by mass.

Metal Particle (A2)

Examples of the metal particle (A2) include a metal particle containing one or more metals selected from the group consisting of Ni, Pd, Pt, Cu, Ag, and Au.

Among these, from the viewpoint of cost and the ease of acquisition and from the perspective of forming a conductive film having low electrical resistance, examples of the preferred metal particle (A2) include a metal particle containing one or more metals selected from the group consisting of Ag, Cu and Ni.

The average particle diameter of the metal particle (A2) is usually within the range of 5 nm to 100 nm. If the average particle diameter of the metal particle (A2) is within the above range, a composition for forming a conductive film with excellent storage stability can be obtained.

Regarding a method for measuring the average particle diameter of the metal particle (A2), three arbitrary points are selected in a field of view measured with a transmission electron microscope (TEM) and photographs are taken at a magnification most suitable for particle diameter measurement. In each of the resulting photographs, 100 particles which appear to be the most common are selected and are measured for their diameter with a measuring device such as a scale. The measured diameters are divided by the measurement magnification to calculate particle diameters, which are arithmetically averaged to determine the average particle diameter.

The purity of the metal particles (A2) is usually 95% or more, preferably 99% or more. The metal particle (A2) may be used singly or as a mixture of two or more.

In the composition for forming a conductive film of the present invention, the content of the metal particles (A2) is usually 1% by mass to 70% by mass, preferably 5% by mass to 50% by mass.

Metalloxane Compound (B)

The metalloxane compound (B) is a compound having a metal-oxygen-metal linkage in its main chain. The metalloxane compound can be obtained, for example, by hydrolytically condensing a compound represented by the following formula (a):

Formula (a)

$$R^a_x M(R^b)_{n-x} \qquad (a)$$

In the above formula (a), M represents a metal selected from the group consisting of Ti, Zr, Sn, Si, and Al; $R^a$ is an organic group having 1 to 8 carbon atoms or a ligand; $R^b$ is a hydrolyzable group; n is a valence of metal M; and x is an integer of 0 to (n−1).

Since the metalloxane compound (B) is less likely to volatilize due to heating during the formation of a conductive film, a conductive film formed from the composition for forming a conductive film of the present invention can reliably exhibit excellent adhesion to a substrate.

Examples of the organic group having 1 to 8 carbon atoms represented by $R^a$ in the above formula (a) include alkyl groups having 1 to 8 carbon atoms, cycloalkyl groups having 3 to 8 carbon atoms, and acetylacetonato ligands having 2 to 20 carbon atoms. Some or all of the hydrogen atoms in the alkyl groups and the cycloalkyl groups may have been replaced by another group.

Examples of the alkyl group having 1 to 8 carbon atoms include a methyl group, an ethyl group, a n-propyl group, an i-propyl group and a butyl group. Of these, an i-propyl group and a butyl group are preferred from the perspective of the ease of hydrolysis.

Examples of the cycloalkyl group having 3 to 8 carbon atoms include a cyclopropyl group, a cyclobutyl group, a cyclopentyl group, and a cyclohexyl group.

Examples of the ligand represented by $R^a$ in the above formula (a) include diketonato anions, such as an acetylacetonato anion; a carboxylate anion, ammonia, amines, ketones, alcohols, and carbon monoxide.

The hydrolyzable group represented by $R^b$ in the above formula (a) denotes a group that can hydrolyze and generate a hydroxy group by being heated at a temperature within the range of from room temperature (about 25° C.) to about 100° C. without the use of a catalyst in the presence of an excess of water.

Examples of the hydrolyzable group represented by $R^b$ in the above formula (a) include alkoxy groups, aryloxy groups, halogen atoms, an acetoxy group, and an isocyanate group. Of these, alkoxy groups are preferred, and a methoxy group, an ethoxy group, a propoxy group, and a butoxy group are more preferred.

Examples of the compound represented by the above formula (a) include metal compounds substituted with four hydrolyzable groups, such as tetra-i-propoxytitanium, tetra-n-butoxytitanium, tetraethoxytitanium, tetramethoxytitanium, tetra-i-propoxyzirconium, tetra-n-butoxyzirconium, tetraethoxyzirconium, and tetramethoxyzirconium; metal compounds substituted with one non-hydrolyzable group and three hydrolyzable groups, such as methyltrimethoxytitanium, methyltriethoxytitanium, methyltri-i-propoxytitanium, methyltributoxyzirconium, ethyltrimethoxyzirconium, ethyltriethoxyzirconium, ethyltri-i-propoxyzirconium, ethyltributoxyzirconium, butyltrimethoxytitanium, phenyltrimethoxytitanium, naphthyltrimethoxytitanium, phenyltriethoxytitanium, naphthyltriethoxytitanium, aminopropyltrimethoxytitanium, aminopropyltriethoxyzirconium, 2-(3,4-epoxycyclohexyl)ethyltrimethoxyzirconium, γ-glycidoxypropyltrimethoxyzirconium, 3-isocyanopropyltrimethoxyzirconium, and 3-isocyanopropyltriethoxyzirconium; titanium compounds, such as triethoxymono(acetylacetonato)titanium, tri-n-propoxymono(acetylacetonato)titanium, tri-i-propoxymono(acetylacetonato)titanium, di-i-propoxybis(acetylacetonato)titanium, and di-n-butoxybis(acetylacetonato)titanium; zirconium compounds, such as triethoxymono(acetylacetonato)zirconium, tri-n-propoxymono(acetylacetonato)zirconium, tri-i-propoxymono(acetylacetonato)zirconium, di-i-propoxybis(acetyl acetonato)zirconium, and di-n-butoxybis(acetylacetonato)zirconium; metal compounds substituted with two non-hydrolyzable groups and two hydrolyzable groups, such as dimethyl dimethoxytitanium, diphenyldimethoxytitanium, and dibutyldimethoxyzirconium; and metal compounds substituted with three non-hydrolyzable groups and one hydrolyzable group, such as trimethylmethoxytitanium, triphenylmethoxytitanium, tributylmethoxytitanium, tri(3-methacryloxypropyl)methoxyzirconium, and tri(3-acryloxypropyl)methoxyzirconium.

Of these, metal compounds substituted with four hydrolyzable groups are preferred as the compound represented by the above formula (a), and tetra-i-propoxytitanium and tetra-n-butoxytitanium are more preferred.

In the synthesis of the metalloxane compound (B), the amount of the compound represented by the formula (a) used is preferably 50 mol % to 100 mol %, more preferably 80 mol % to 100 mol % relative to all hydrolyzable metal compounds used. When the amount of the compound (i) is less than 50 mol %, a metalloxane compound with desired properties as the component (B) of the composition for forming a conductive film of this embodiment may be prevented from being obtained.

The method of hydrolytically condensing the compound represented by the above formula (a) can be carried out by a method known in the art.

The content of the metalloxane compound which is the component (B) in the composition for forming a conductive film of the embodiment of the present invention is usually 20% by mass to 80% by mass, preferably 30% by mass to 70% by mass, more preferably 40% by mass to 60% by mass, where the overall mass of the component (A) and the component (B) contained in the composition for forming a conductive film of this embodiment is taken as 100% by mass.

Amine Compound (C)

The composition for forming a conductive film according to the present embodiment of the present invention includes component (A) and the component (B), and may further comprise an amine compound (C).

Examples of the amine compound (C) include a compound represented by at least one of the following formula (1), the following formula (2), and the following formula (3).

Formula (1)

(1)

In the formula (1), $R^1$ and $R^2$ each independently represent a hydrogen atom, an alkyl group having 1 to 18 carbon atoms, or an alicyclic hydrocarbon group having 3 to 18 carbon atoms. $R^3$ represents a single bond, a methylene group, an alkylene group having 2 to 12 carbon atoms, or a phenylene group. $R^4$ represents a hydrogen atom, an alkyl group having 1 to 18 carbon atoms, an alicyclic hydrocarbon group having 3 to 18 carbon atoms, an amino group, a dimethylamino group, or a diethylamino group.

Formula (2)

(2)

In the formula (2), $R^5$ and $R^6$ each independently represent a hydrogen atom, an alkyl group having 1 to 18 carbon atoms, or an alicyclic hydrocarbon group having 3 to 18 carbon atoms. $R^7$ represents a methylene group, an alkylene group having 2 to 12 carbon atoms, or a phenylene group. $R^8$ represents, an alkyl group having 1 to 18 carbon atoms, or an alicyclic hydrocarbon group having 3 to 18 carbon atoms. It is noted that, when $R^5$ and $R^6$ are hydrogen atoms, $R^8$ represents a group other than a methyl group and an ethyl group.

Formula (3)

(3)

[0

In the formula (3), $R^9$ and $R^{10}$ each independently represent a hydrogen atom, an alkyl group having 1 to 18 carbon atoms, or an alicyclic hydrocarbon group having 3 to 18 carbon atoms. $R^{11}$ represents a methylene group, an alkylene group having 2 to 12 carbon atoms, or a phenylene group. $R^{12}$ and $R^{13}$ each independently represent, an alkyl group having 1 to 18 carbon atoms, or an alicyclic hydrocarbon group having 3 to 18 carbon atoms.

Examples of the groups $R^1$ and $R^2$ which the amine compound represented by the above formula (1) contains include, in addition to a hydrogen atom, linear alkyl groups, such as a methyl group, an ethyl group, a propyl group, a butyl group, a pentyl group, a hexyl group, a heptyl group, an octyl group, a nonyl group, a decyl group, an undecyl group, a dodecyl group, and a stearyl group, branched alkyl groups, such as an isopropyl group, a sec-butyl group, an isobutyl group, a tert-butyl group, an isopentyl group, a neopentyl group, a tert-pentyl group, a 1-ethylpropyl group, a, 1,1-dimethylpropyl group, a 1,2-dimethylpropyl group, a 1,1,2-trimethylpropyl group, a 1,2,2-trimethylpropyl group, a 1,3-dimethylbutyl group, a 1,5-dimethylhexyl group, a 2-ethylhexyl group, a 4-heptyl group, and a 2-heptyl group, and alicyclic hydrocarbon groups, such as a cyclohexyl group and a cyclopentyl group.

Example of the groups $R^4$ which the amine compound represented by the above formula (1) contains include, in addition to a hydrogen atom, an amino group, a dimethylamino group, and a diethylamino group, linear alkyl groups, such as a methyl group, an ethyl group, a propyl group, a butyl group, a pentyl group, a hexyl group, a heptyl group, an octyl group, a nonyl group, a decyl group, an undecyl group, a dodecyl group, and a stearyl group, branched alkyl groups, such as an isopropyl group, a sec-butyl group, an isobutyl group, a tert-butyl group, an isopentyl group, a neopentyl group, a tert-pentyl group, a 1-ethylpropyl group, a, 1,1-dimethylpropyl group, a 1,2-dimethylpropyl group, a 1,1,2-trimethylpropyl group, a 1,2,2-trimethylpropyl group, a 1,3-dimethylbutyl group, a 1,5-dimethylhexyl group, a 2-ethylhexyl group, a 4-heptyl group, and a 2-heptyl group, and alicyclic hydrocarbon groups, such as a cyclohexyl group and a cyclopentyl group.

Specific examples of the amine compound represented by the above formula (1) include methyl amine, ethylamine, propylamine, butylamine, pentylamine, hexylamine, heptylamine, octyl amine, nonylamine, decylamine, undecylamine, dodecylamine, stearyl amine, isopropyl amine, sec-butyl amine, isobutyl amine, tert-butyl amine, isopentylamine, neopentylamine, tert-pentylamine, 1-ethylpropylamine, 1,1-dimethylpropylamine, 1,2-dimethylpropylamine, 1,1,2-trimethylpropylamine, 1,2,2-trimethylpropylamine, 1,3-dimethylbutylamine, 1,5-dimethylhexylamine, 2-ethylhexylamine, 4-heptylamine, 2-heptylamine, cyclohexylamine, cyclopentylamine, ethylenediamine, N-methylethylenediamine, N,N'-dimethylethylenediamine, N,N,N',N'-tetramethylethylenediamine, N-ethylethylenediamine, N,N'-diethylethylenediamine, 1,3-propanediamine, N,N'-dimethyl-1,3-propanediamine, 1,4-butanediamine, N,N'-dimethyl-1,4-butanediamine, 1,5-pentanediamine, N,N'-dimethyl-1,5-pentanediamine, 1,6-hexanediamine, and N,N'-dimethyl-1,6-hexanediamine.

Examples of the groups $R^5$ and $R^6$ which the amine compound represented by the above formula (2) contains include, in addition to a hydrogen atom, linear alkyl groups, such as a methyl group, an ethyl group, a propyl group, a butyl group, a pentyl group, a hexyl group, a heptyl group, an octyl group, a nonyl group, a decyl group, an undecyl group, a dodecyl group, and a stearyl group, branched alkyl groups, such as an isopropyl group, a sec-butyl group, an isobutyl group, a tert-butyl group, an isopentyl group, a neopentyl group, a tert-pentyl group, a 1-ethylpropyl group, a, 1,1-dimethylpropyl group, a 1,2-dimethylpropyl group, a 1,1,2-trimethylpropyl group, a 1,2,2-trimethylpropyl group, a 1,3-dimethylbutyl group, a 1,5-dimethylhexyl group, a 2-ethylhexyl group, a 4-heptyl group, and a 2-heptyl group, and alicyclic hydrocarbon groups, such as a cyclohexyl group and a cyclopentyl group.

Example of the group $R^8$ which the amine compound represented by the above formula (2) contains include, linear alkyl groups, such as a methyl group, an ethyl group, a propyl group, a butyl group, a pentyl group, a hexyl group, a heptyl group, an octyl group, a nonyl group, a decyl group, an undecyl group, a dodecyl group, and a stearyl group, branched alkyl groups, such as an isopropyl group, a sec-butyl group, an isobutyl group, a tert-butyl group, an isopentyl group, a neopentyl group, a tert-pentyl group, a 1-ethylpropyl group, a, 1,1-dimethylpropyl group, a 1,2-dimethylpropyl group, a 1,1,2-trimethylpropyl group, a 1,2,2-trimethylpropyl group, a 1,3-dimethylbutyl group, a 1,5-dimethylhexyl group, a 2-ethylhexyl group, a 4-heptyl group, and a 2-heptyl group, and alicyclic hydrocarbon groups, such as a cyclohexyl group and a cyclopentyl group. It is noted that, when both $R_5$ and $R_6$ are hydrogen atoms, $R_8$ represents a group other than a methyl group and an ethyl group.

Specific examples of the amine compound represented by the above formula (2) include methoxy(methyl)amine, 2-methoxyethyl amine, 3-methoxypropyl amine, 4-methoxybutylamine, ethoxy(methyl)amine, 2-ethoxyethylamine, 3-ethoxypropylamine, 4-ethoxybutylamine, propoxymethylamine, 2-propoxyethylamine, 2-isopropoxypropyl amine, 3-isopropoxypropylamine, 2-propoxypropylamine, 3-propoxypropylamine, 4-propoxybutylamine, butoxymethylamine, butoxyethylamine, 2-butoxypropylamine, 3-butoxypropylamine, 3-(2-ethylhexyloxy)propylamine, 3-isobutoxypropylamine, 4-butoxybutylamine, and oxybis(ethylamine).

Examples of the groups $R^9$ and $R^{10}$ which the amine compound represented by the above formula (3) contains include, in addition to a hydrogen atom, linear alkyl groups, such as a methyl group, an ethyl group, a propyl group, a butyl group, a pentyl group, a hexyl group, a heptyl group, an octyl group, a nonyl group, a decyl group, an undecyl group, a dodecyl group, and a stearyl group, branched alkyl groups, such as an isopropyl group, a sec-butyl group, an isobutyl group, a tert-butyl group, an isopentyl group, a neopentyl group, a tert-pentyl group, a 1-ethylpropyl group, a, 1,1-dimethylpropyl group, a 1,2-dimethylpropyl group, a 1,1,2-trimethylpropyl group, a 1,2,2-trimethylpropyl group, a 1,3-dimethylbutyl group, a 1,5-dimethylhexyl group, a 2-ethylhexyl group, a 4-heptyl group, and a 2-heptyl group, and alicyclic hydrocarbon groups, such as a cyclohexyl group and a cyclopentyl group.

Examples of the groups $R^{12}$ and $R^{13}$ which the amine compound represented by the above formula (3) contains include, linear alkyl groups, such as a methyl group, an ethyl group, a propyl group, a butyl group, a pentyl group, a hexyl group, a heptyl group, an octyl group, a nonyl group, a decyl group, an undecyl group, a dodecyl group, and a stearyl group, branched alkyl groups, such as an isopropyl group, a sec-butyl group, an isobutyl group, a tert-butyl group, an isopentyl group, a neopentyl group, a tert-pentyl group, a 1-ethylpropyl group, a, 1,1-dimethylpropyl group, a 1,2-dimethylpropyl group, a 1,1,2-trimethylpropyl group, a 1,2,2-trimethylpropyl group, a 1,3-dimethylbutyl group, a 1,5-dimethylhexyl group, a 2-ethylhexyl group, a 4-heptyl group, and a 2-heptyl group, and alicyclic hydrocarbon groups, such as a cyclohexyl group and a cyclopentyl group.

Specific examples of the amine compound represented by the above formula (3) include aminoacetaldehyde diethylacetal.

The content of the amine compound (C) may be adjusted to not more than 99% by mass and is preferably 0.1% by mass to 99% by mass, more preferably 1% by mass to 90% by mass, even more preferably 2% by mass to 70% by mass, where the overall mass of all the components contained in the composition for forming a conductive film of this embodiment is taken as 100% by mass. As a result of adjusting the content of the amine compound (C) to 0.1% by mass to 99% by mass, a conductive film having excellent electrical conductivity can be formed. As a result of adjusting the content of the amine compound (C) to 1% by mass to 90% by mass, a conductive film having a lower electrical resistance value can be formed by heating at a lower temperature. As a result of adjusting to 2% by mass to 70% by mass, formation of a conductive film having a low electrical resistance value can be attained and the composition for forming a conductive film excellent in productivity can be prepared.

Solvent

The composition for forming a conductive film of this embodiment may comprise a solvent in addition to the component (A) and the component (B). Inclusion of the solvent in the composition for forming a conductive film makes it easy to control the viscosity of the composition for forming a conductive film according to a coating method and makes it possible to form a conductive film having uniform physical properties.

The solvent is not particularly limited as long as it does not participate in the reaction of the component (A) and the component (B). Examples of the solvent include one liquid or two or more compatible liquids selected from among water, alcohols, ethers, esters, aliphatic hydrocarbons, and aromatic hydrocarbons.

Examples of the alcohols include methanol, ethanol, n-propyl alcohol (1-propanol), i-propyl alcohol, n-butyl alcohol (1-butanol), i-butyl alcohol, sec-butyl alcohol, pentanol, hexanol, heptanol, octanol, nonyl alcohol, decanol, cyclohexanol, benzyl alcohol, terpineol, and dihydroterpineol.

Examples of the ethers include (poly)alkylene glycol alkyl ethers such as hexyl methyl ether, diethylene glycol dimethyl ether, diethylene glycol diethyl ether, diethylene glycol methyl ethyl ether, triethylene glycol dimethyl ether, triethylene glycol diethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether, tripropylene glycol dimethyl ether, and tripropylene glycol diethyl ether, tetrahydrofuran, tetrahydropyrane, and 1,4-dioxane.

Examples of the esters include methyl formate, ethyl formate, butyl formate, methyl acetate, ethyl acetate, butyl acetate, methyl propionate, ethyl propionate, butyl propionate, γ-butyrolactone, propylene glycol methyl ether acetate, propylene glycol ethyl ether acetate, and dipropylene glycol methyl ether acetate.

Examples of the aliphatic hydrocarbons include n-pentane, n-hexane, n-heptane, n-octane, n-nonane, n-decane, n-undecane, n-dodecane, tetradecane, cyclohexane, and decalin.

Examples of the aromatic hydrocarbons include benzene, toluene, xylene, ethylbenzene, n-propylbenzene, i-propylbenzene, n-butylbenzene, mesitylene, tetralin, chlorobenzene, and dichlorobenzene.

Among these organic solvents, ethers are preferred from the perspective of ease of performing control of the viscosity of the composition for forming a conductive film.

The content of the solvent is usually within the range of 0% by mass to 95% by mass, where the overall mass of all the components contained in the composition for forming a conductive film of this embodiment of the present invention is taken as 100% by mass.

Other Arbitrary Components

The composition for forming a conductive film of this embodiment may contain other arbitrary components in addition to the above-described component (A) and the above-described component (B) unless the effect of the present invention is impaired. As such other arbitrary components, the composition may contain at least one of formic acid and ammonium formate, and moreover the composition may contain a dispersing agent, an antioxidant, a concentration regulator, a surface tension regulator, a viscosity regulator, a coating film-forming aid, an adhesion aid, etc.

Formic acid and ammonium formate, which are arbitrary components, have an effect of promoting a reduction reaction during forming a conductive film from the composition for forming a conductive film of this embodiment and can promote the formation of a conductive film with a desired electrical resistance characteristic.

The content of formic acid and ammonium formate is usually within the range of 0% by mass to 50% by mass, where the overall mass of all the components contained in the composition for forming a conductive film of this embodiment is taken as 100% by mass.

As mentioned above, a composition for forming a conductive film having low resistance and superior adhesion to a substrate can be provided.

Method for Producing a Composition for Forming a Conductive Film

The composition for forming a conductive film of this embodiment of the present invention can be produced by mixing the above-described component (A) and the component (B), and the amine compound (C), the solvent and other optional components uniformly according to necessity.

Examples of the mixing method for forming a conductive film of this embodiment include stirring with a stirring blade, stirring with a stirrer and a stirring bar, stirring with a boiler, and a method using an ultrasonic homogenizer, a bead mill, a paint shaker, or a stirring-defoaming apparatus. Regarding the conditions for mixing, in the case of, for example, stirring with a stirring blade, the rotation speed of the stirring blade is usually within the range of 1 rpm to 4000 rpm, preferably within the range of 10 rpm to 2000 rpm.

Conductive Film and Method for Producing the Conductive Film

The conductive film of the present invention can be produced using the composition for forming a conductive film of the present invention. For example, the conductive film can be produced by a method including a step (1) of forming a coating film of a composition for forming a conductive film by applying the composition for forming a conductive film onto a substrate, and a step (2) of heating the coating film.

In the above-described method for producing a conductive film, a coating film of the composition for forming a conductive film of this embodiment applied onto a substrate is heated. Owing to this, when the component (A) contains a metal salt, the metal ion of the metal salt undergoes a reduction reaction to generate a metal particle. On the other hand, the component (B) in the coating film inhibits the metal particle contained as a component (A) and a metal particle formed from the metal salt of the component (A) from agglomerating during heating. The component (B) tightly enters between the surface of the substrate and the conductive film to enhance the adhesion between the conductive film and the substrate. As a result, the conductive film of this embodiment is believed to have low resistance and capable of exhibiting excellent adhesion to a substrate.

[Step (1)]

Examples of the substrate include resin substrates, such as low-density polyethylene resin, high-density polyethylene resin, ABS resin (acrylonitrile/butadiene/styrene copolymerized synthetic resin), acrylic resin, styrenic resin, vinyl chloride resin, polyester resin (polyethylene terephthalate, polytrimethylene terphthalate, polybutylene terephthalate, polyethylene naphthalate, polybutylene naphthalate), polyacetal resin, and cellulose derivatives;

paper substrates, such as non-coated printing paper, finely coated printing paper, coated printing paper (art paper and coat paper), special printing paper, copy paper (paper for PPC), unbleached wrapping paper (heavy duty sack kraft paper and duty sack kraft paper), bleached wrapping paper (bleached kraft paper and white roll paper), coated cardboard, chipped cardboard, and corrugated paper;

metal substrates, such as copper, iron, silver, gold, platinum, aluminum, nickel, titanium, tantalum, cobalt, tungsten, ruthenium, and lead;

metal alloy substrates, such as duralumin and stainless steel, nonmetallic substrates, such as carbon, silicon, gallium, and zirconium;

ceramic substrates, such as alumina, titania, tin oxide, yttrium oxide, barium titanate, strontium titanate, sapphire, zirconia, gallium nitride, silicon nitride, titanium nitride, tantalum nitride, polysilicon, and ITO (indium tin oxide); and glass substrates, such as soda glass, borosilicate glass, silica glass, quartz glass, and chalcogen glass.

Examples of the coating method of the composition for forming a conductive film include ink jet printing, gravure printing, flexographic printing, (silk) screen printing, relief printing, a spin coating process, a spray coating process, a bar coating process, a casting process, a dip coating process, and a roll coater process.

[Step (2)]

The heating temperature of the step (2) in the case where the composition for forming a conductive film contains a metal salt as the component (A) may be any temperature at which the metal salt of the component (A) is reduced and unnecessary organic substances are decomposed and volatilized. The heating temperature of the step (2) is usually chosen within the range of 50° C. to 300° C., preferably within the range of 50° C. to 250° C., and more preferably within the range of 50° C. to 200° C. If the heating temperature is within the above range, the reduction reaction of the metal salt proceeds completely. Furthermore, in this situation a substrate made of an organic materials can also be used.

When the heating temperature is 300° C. or lower, conventional technologies have a problem of degradation in the properties of a conductive film due to insufficient heating. However, a conductive film with desired properties can be formed by the method for forming a conductive film of this embodiment even under heating conditions of 300° C. or lower.

The heating time of step (2) is not particularly limited and may be chosen in view of the types of components in the composition for forming a conductive film, and the electrical conductivity (electrical resistance value) of a desired metal film. For example, when a relatively low heating temperature as low as about 200° C. or lower is chosen, the heating time is preferably set to about 5 minutes to about 100 minutes.

Method for Producing a Plating Film, and Plating Film

The method for producing a plating film of the present invention is a method of producing a plating film using the conductive film of the present invention as a seed layer for plating treatment.

Electronic Device

The electronic device of the present invention is a device which uses the conductive film or plating film of the present invention and into which a wiring board containing these films as wires or an electrode is built.

Regarding a method of forming a wire from the conductive film or plating film of the present invention, the wire can be formed by a direct photofabrication approach, for example.

Examples of the electronic device include an antenna, a sensor, a capacitor, a touch panel, and an organic EL.

The touch panel which is an example of the electronic device of this embodiment of the present invention will be described below.

Touch Panel

The touch panel is, for example, a touch panel having a light-transmissive dielectric film formed, on a substrate on which a sensing electrode and a lead wire for leading the electrode are provided, so that the dielectric film may cover the sensing electrode. This touch panel may, for example, be used as the electrostatically capacitive touch panel.

In the touch panel of an embodiment of the present invention, a structure in which the above-described dielectric film is not provided is also available.

Figure 1:
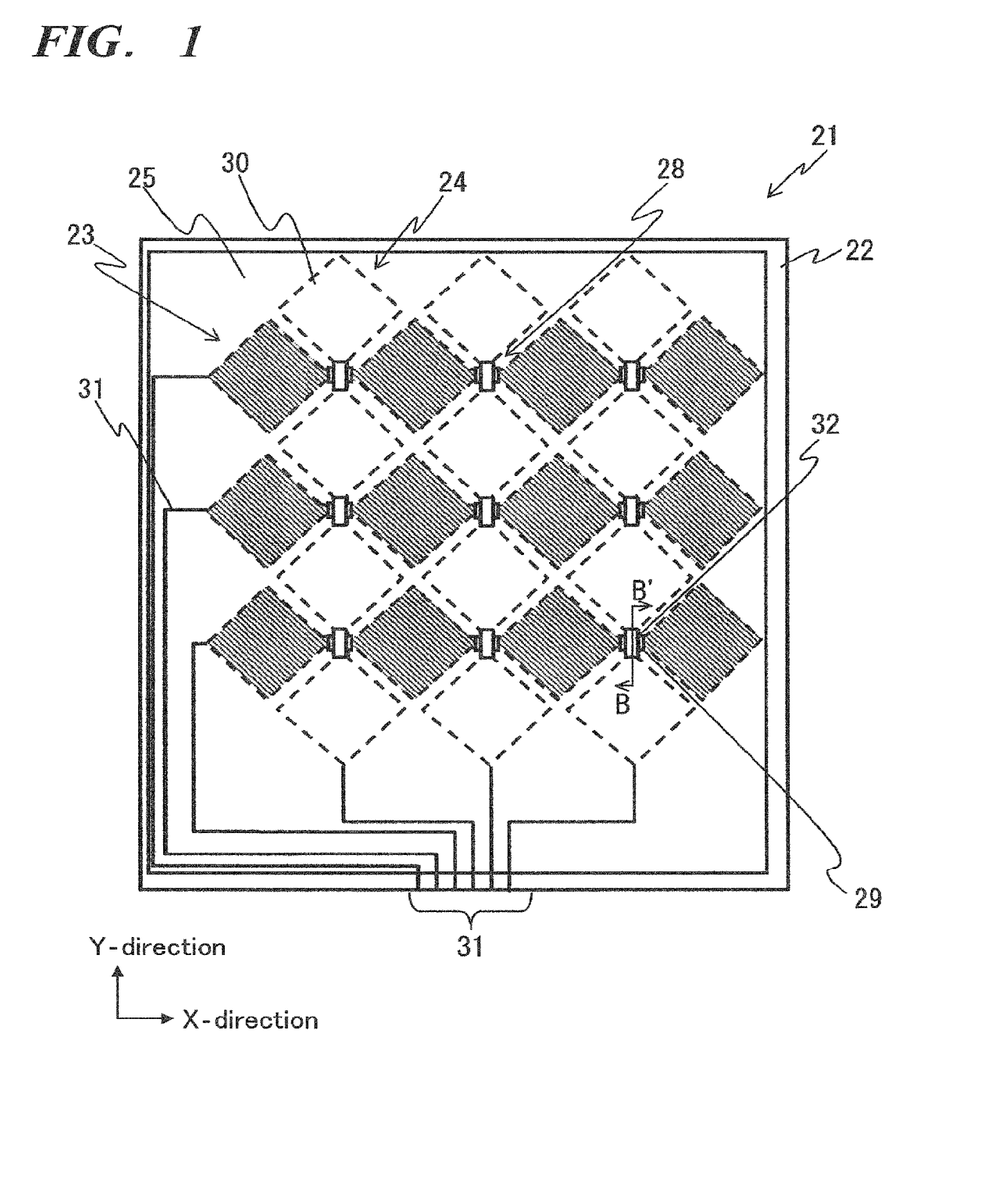
FIG. 1 is a plan view illustrating an example of the touch panel according to the present embodiment.

FIG. 1 is a plan view illustrating an example of the touch panel according to the present embodiment.

Figure 2:
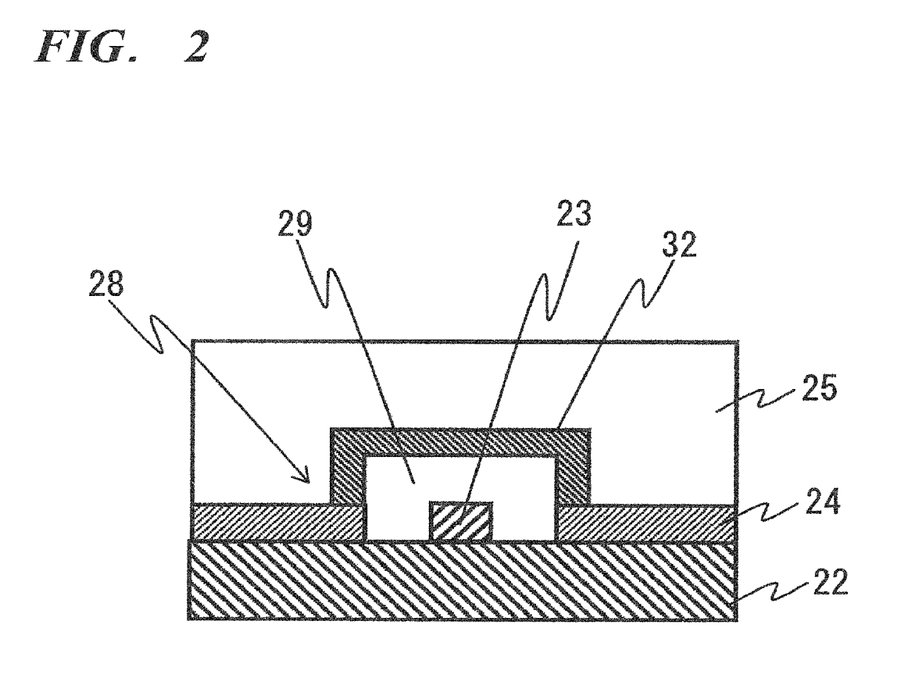
FIG. 2 is a cross-sectional view viewed along the B-B' line of FIG. 1.

FIG. 2 is a cross-sectional view viewed along the B-B' line of FIG. 1.

As shown in FIG. 1, the touch panel 21, which is one example of this embodiment, has a first sensing electrode 23 extending in the direction X, and a second sensing electrode 24 extending in the direction Y which perpendicularly intersects the direction of X, on the surface of the transparent substrate 22.

The transparent substrate 22 may be a glass substrate. Alternatively, the transparent substrate 22 may be a resin substrate, and in this case, a polyethylene terephthalate film, a polybutylene terephthalate film, a polyethylene film, a polypropylene film, a polyethersulfone film, a polycarbonate film, a polyacrylic film, a polyvinylchloride film, a polyimide film, a film of a ring-open polymer of a cyclic olefin, a film made of a hydrogenated material, and the like can be used. In the case of a glass substrate, the thickness of the transparent substrate 22 may be adjusted to 0.1 mm to 3 mm. In the case of a resin substrate, the thickness may be adjusted to 10 μm to 3000 μm.

In the touch panel 21 a plurality of first sensing electrodes 23 and the second sensing electrodes 24 are disposed. The first sensing electrode 23 and the second sensing electrode 24 are disposed in a matrix in an operation region of a touch panel 21. The first sensing electrode 23 is used in order to detect the coordinates of the direction Y of the position touched by an operator. The second sensing electrode 24 is used in order to detect the coordinates of the direction X of the position touched by an operator. The first sensing electrode 23 and the second sensing electrode 24 are provided in the same layer of the same side of the transparent substrate 22. The number of the first sensing electrode 23 and the second sensing electrodes 24 is not particularly limited as in FIG. 1 and is preferably determined according to the size of an operation region and the detection accuracy of the touch position needed. That is, the touch panel 21 may be constituted using a larger number of or a smaller number of the first sensing electrodes 23 and the second sensing electrodes 24.

As shown in FIG. 1, each of the first sensing electrode 23 and the second sensing electrode 24 is composed of a plurality of rhombic electrode pads 30. The first sensing electrode 23 and the second sensing electrode 24 are arranged in such a manner that the electrode pad 30 of the first sensing electrode 23 is spaced apart from the adjacent electrode pad 30 of the second sensing electrode 24. In this situation, the gap between these electrode pads 30 is made to be as significantly small as possible while allowing an insulating property to be secured.

The first sensing electrode 23 and the second sensing electrode 24 are arranged so that a portion at which they intersect one another can be rendered as small as possible. Moreover, the electrode pads 30 which constitute the first sensing electrode 23 and the second sensing electrode 24 are arranged throughout the operation region of the touch panel 21.

Although the electrode pad 30 may be in a rhombic shape as shown in FIG. 1, the electrode pad 30 is not limited to this shape and may be in a polygonal shape, such as a hexagonal shape.

Each of the first sensing electrode 23 and the second sensing electrode 24 is preferably a transparent electrode so as not to deteriorate the visibility of a display of a liquid crystal display element (not shown) or the like disposed under the touch panel 21. The transparent electrode as used herein refers to an electrode that is highly transparent to visible light. As the first sensing electrode 23 and the second sensing electrode 24, electrodes made of transparent conductive materials, such as an electrode made of ITO and an electrode made of indium oxide and zinc oxide, can be used. When the first sensing electrode 23 and the second sensing electrode 24 are each made of ITO, the thickness thereof is preferably adjusted to 10 nm to 100 nm so that sufficient electrical conductivity can be secured.

The formation of the first sensing electrode 23 and the second sensing electrode 24 can be carried out using a method known in the art. For example, the formation of the first sensing electrode 23 and the second sensing electrode 24 can be performed by forming a film made of a transparent conductive material such as ITO by a sputtering process, or the like, and then patterning the film using a photolithographic process, or the like.

As shown in FIG. 1 and FIG. 2, the first sensing electrode 23 and the second sensing electrode 24 are formed on the same side of the transparent substrate 22 and form the same layer. Therefore, the first sensing electrode 23 and the second sensing electrode 24 intersect one another at a plurality of points in an operation region, forming intersections 28.

In the touch panel 21 of this embodiment, one of the first sensing electrode 23 and the second sensing electrode 24 is interrupted so as not to contact with the other at an intersection 28 as shown in FIG. 2. That is, the first sensing electrode 23 is continuous at the intersection 28, but the second sensing electrode 24 extending in the lateral direction of FIG. 2 is formed to be interrupted. In order to electrically connect the interrupted part of the second sensing electrode 24, a bridge electrode 32 is provided. An interlayer dielectric film 29 made of an insulating substance is provided between the bridge electrode 32 and the first sensing electrode 23.

As shown in FIG. 2, the interlayer dielectric film 29 provided on the first sensing electrode 23 at an intersection 28 is formed from a material with excellent light transmission properties. The interlayer dielectric film 29 can be formed by applying a polysiloxane, an acrylic resin, an acrylic monomer, etc. by a printing process, optionally patterning the film according to necessity, and then heat curing the film. When the film has been formed using a polysiloxane, the interlayer dielectric film 29 is an inorganic insulating layer made of a silicon oxide ($SiO_2$). When an acrylic resin and an acrylics monomer are used, the interlayer dielectric film 29 is an organic insulating layer made of resin. When $SiO_2$ is used for the interlayer dielectric film 29, the interlayer dielectric film 29 can also be constituted, for example, by forming an $SiO_2$ film only on the first sensing electrode 23 at an intersection 28 by a sputtering process using a mask.

A bridge electrode 32 is provided on the upper layer of the interlayer dielectric film 29. As described above, the bridge electrode 32 functions in electrically connecting the second sensing electrode 24 interrupted at the intersection 28. Preferably, the bridge electrode 32 is formed of a material with excellent light transmission properties, such as ITO. The second sensing electrode 24 can be electrically connected in the direction Y by providing the bridge electrode 32.

As shown in FIG. 1, the first sensing electrode 23 and the second sensing electrode 24 have a shape formed by vertically or horizontally arranging a plurality of rhombic electrode pads 30 as described above. In the first sensing electrode 23, the connection portion located at an intersection 28 is in a shape narrower than the width of the rhombic electrode pads 30 of the first sensing electrode 23. In addition, the bridge electrode 32 is also formed in a strip-like shape that is narrower in width than the rhombic electrode pads 30.

At each of the ends of the first sensing electrode 23 and the second sensing electrode 24 of the touch panel 21 a terminal is provided (not shown), and a lead wire 31 is drawn from each of the terminals. The lead wire 31 may be a wire using a conductive film of the above-described embodiment of the present invention, such as a copper film. Similarly, the terminals also may be formed using the conductive film of the embodiment of the present invention.

That is, the lead wires 31 and the like of the touch panel 21 may be formed by following the method for forming a conductive film of the above-described embodiment of the present invention using the composition for forming a conductive film of the above-described embodiment of the present invention.

For example, a wiring pattern is formed by forming a coating film of the composition for forming a conductive film of this embodiment by the coating method described as an example of the method for forming a conductive film of the embodiment of the present invention, on a transparent substrate 22 on which the first sensing electrode 23, the second sensing electrode 24, etc. have been formed. For example, a wiring pattern can be formed by forming a coating film by direct image drawing using an ink jet printing method, a gravure printing method, a gravure offset printing method, a reverse offset printing method, a flexographic printing method, a (silk) screen printing method, relief printing, or the like.

As described above, the lead wires 31, etc. can be formed by heating under the air or under a non-oxidative atmosphere using an inert gas, such as nitrogen gas, helium gas, and argon gas.

Heating of a coating film can be performed also under a reductive atmosphere using a reductive gas, such as hydrogen gas, as described above.

The lead wires 31 are electrically connected to an external control circuit (not shown) for detecting the positions of voltage application to the first sensing electrode 23 and the second sensing electrode 24 or the position of touch operation using the contact terminals (not shown) at the ends of the lead wires.

As shown in FIG. 1 and FIG. 2, on the surface of the transparent substrate 22 on which the first sensing electrode 23 and the second sensing electrode 24 have been disposed, a light-transmissive dielectric film 25 has been disposed so that the first sensing electrode 23 and the second sensing electrode 24 may be covered therewith.

The dielectric film 25 is formed by being patterned so as to cover and protect the first sensing electrode 23 and the second sensing electrode 24 in the operation region of the touch panel 21. In addition, the dielectric film 25 is formed by being patterned in such a manner that the contact terminals (not shown) of the ends of the lead wires 31 drawn from the first sensing electrode 23 and the second sensing electrode 24 are exposed.

For the formation of the dielectric film 25, a radiation-sensitive resin composition can be used. The dielectric film 25 can be disposed on the first sensing electrode 23 and the second sensing electrode 24 by performing prescribed patterning.

The touch panel 21 can be provided with a cover film (not shown) made of transparent resin, on the surface of the transparent substrate 22 on which the first sensing electrode 23 and the second sensing electrode 24 have been formed. The cover film can be provided using an adhesive layer (not shown) made of an acrylic transparent adhesive agent, for example.

The touch panel 21 having the configuration described above can measure an electrostatic capacitance in an operation region where the first sensing electrode 23 and the second sensing electrode 24 have been disposed in a matrix. In addition, the touch panel 21 can detect a position of contact with a finger or the like from a change in electrostatic capacitance generated upon a touch operation of the finger of an operator, or the like. The touch panel 21 is put on a display of a liquid crystal display element, an organic EL element, or the like and is suitably used as an input device of a display of an electronic device.

Therefore, a conductive film of an embodiment of the present invention, such as a copper film, can be formed by following a method for forming a conductive film of an embodiment of the present invention using a composition for forming a conductive film of an embodiment of the present invention. In addition, lead wires are constituted using the conductive film, and a touch panel can be constituted using the lead wires.

EXAMPLES

Embodiments of the present invention will be described more specifically below with reference to examples. However, the present invention is not to be limited to these Examples.

[Weight Average Molecular Weight (Mw) and Number Average Molecular Weight (Mn)]

The method for measuring method a weight average molecular weight (Mw) and a number average molecular weight (Mn) is described below. Mw and Mn of a polymer are measured under the following conditions by gel permeation chromatography (GPC) using GPC columns produced by TOSOH Corporation (two G2000HXLs, one G3000HXL, and one G4000HXL).

Eluant: tetrahydrofuran (produced by Wako Pure Chemical Industries, Ltd.)
Flow rate: 1.0 mL/min
Sample concentration: 1.0% by mass
Sample injection: 100 μL
Detector: differential refractometer
Standard substance: monodisperse polystyrene Synthesis of Metalloxane Compound Synthesis Example 1: Synthesis of Methyltrimetoxysilane/Phenyltrimethoxysilane Polycondensate (PMPS)

A container equipped with a stirrer was charged with 24 g of propylene glycol monomethyl ether, and subsequently, 39 g of methyltrimetoxysilane (MTMS) and 18 g of phenyltrimethoxysilane (PTMS) were added and heated to a solution temperature of 60° C. After the solution temperature reached 60° C., 0.1 g of formic acid and 19 g of ion-exchanged water were added and heated to 75° C., and then held for 2 hours. After cooling to 45° C., 28 g of methyl orthoformate was added as a dehydrating agent, and stirred for 1 hour. Moreover, the solution temperature was brought down to 40° C., and then ion-exchanged water and methanol generated from hydrolytic condensation were removed by carrying out evaporation while maintaining the temperature. Thus, a PMPS solution was obtained. The PMPS solutions had a solid concentration of 30% by mass and a weight average molecular weight (Mw) of 2000.

Synthesis Example 2: Synthesis of Titaniumtetraisopropoxide Polycondensate (TTIP)

To a three-neck flask equipped with a stirring bar, a reflux condenser, and a thermometer was charged 5.8 g of titanium tetraisopropoxide, which was then dissolved in 100 ml of tetrahydrofuran (THF) and stirred at 5° C. Moreover, a solution of 0.6 g of water in 20 ml of THE was dropped slowly, and then the temperature was raised to 66° C. and a reaction was carried out for 3 hours. After cooling the reaction, concentration was carried out by use of an evaporator, thereby obtaining a yellow viscous material. IR and NMR revealed that the resulting yellow viscous material contained a polytitanoxane isopropoxide (TTIP) having isopropoxide groups on side chains. The weight average molecular weight (Mw) was 1800.

Synthesis Example 3: Synthesis of Titanosiloxane Polymer (TS)

To a three-neck flask equipped with a stirring bar, a reflux condenser, and a thermometer was charged a solution of 12.0 g of tetraethoxysilane mixed in 50 ml of methanol, and then a solution in which 1.87 g of water, 0.83 g of 6 N hydrochloric acid, and 50 ml of methanol had been mixed together was added thereto at 0° C. and a partial hydrolysis reaction was carried out. Then, a solution in which 18.2 g of di-i-propoxybis(acetylacetonato)titanium and 20 ml of isopropanol had been mixed together was added, a reaction was carried out for 1 hour at a reflux temperature of the solvent. Thus, a reaction mixture was obtained. After cooling the reaction, concentration was carried out by use of an evaporator, thereby obtaining a highly viscous material composed of a titanosiloxane polymer (TS). The weight average molecular weight (Mw) was 2200.

Synthesis Example 4: Synthesis of Zirconosiloxane Polymer (ZS)

To a three-neck flask equipped with a stirring bar, a reflux condenser, and a thermometer was charged a solution of 10.4 g of tetraethoxysilane mixed in 50 ml of methanol, and then a solution in which 1.87 g of water, 0.83 g of 6 N hydrochloric acid, and 50 ml of methanol had been mixed together was added thereto at 0° C. and a partial hydrolysis reaction was carried out. Then, a solution in which 10.2 g of di-i-propoxybis(acetylacetonato)zirconium and 10 ml of ethanol had been mixed together was added, a reaction was carried out for 1 hour at a reflux temperature of the solvent. Thus, a reaction mixture was obtained. After cooling the reaction, concentration was carried out by use of an evaporator, thereby obtaining a highly viscous material composed of a zirconosiloxane polymer (ZS). The weight average molecular weight (Mw) was 2500.

Synthesis Example 5: Synthesis of di-i-propoxybis(acetylacetonato)titanium condensate (PAT)

To a three-neck flask equipped with a stirring bar, a reflux condenser, and a thermometer was charged 5.8 g of di-i-propoxybis(acetylacetonato)titanium, which was then dissolved in 100 ml of tetrahydrofuran (THF) and stirred at 5° C. Moreover, a solution of 0.5 g of water in 20 ml of THF was dropped slowly, and then the temperature was raised to 66° C. and a reaction was carried out for 3 hours. After cooling the reaction, concentration was carried out by use of an evaporator, thereby obtaining a di-i-propoxybis(acetylacetonato)titanium condensate (PAT) as a highly viscous material. The weight average molecular weight (Mw) was 2400.

Synthesis of Silver Formate

Synthesis Example 6

A container equipped with a stirrer was charged with 250 g of ethanol, 8.35 g of silver acetate, and 2.3 g of formic acid, which were then stirred for 5 minutes. The precipitate formed was washed with ethanol, obtaining silver formate.

Synthesis of Silver Particle

Synthesis Example 7

A flask, a reaction vessel, was charged with 13.8 g (0.188 mol) of N-butylamine (BA) as an amine compound and cooled in an ice bath. Under stirring, 5.4 g (0.118 mol) of formic acid was dropped, thereby preparing a salt of n-butylamine (BA) and formic acid. Next, 21.8 g (0.094 mol) of silver oxide (I), 9.51 g (0.094 mol) of n-hexylamine (HA), 6.06 g (0.047 mol) of n-octylamine (OA), and 8.71 g (0.047 mol) of n-dodecyl amine (DA) were mixed in another flask and then stirred, thereby preparing a silver oxide dispersion solution.

Subsequently, the above-described salt of n-butylamine (BA) and formic acid was dropped into the silver oxide dispersion solution contained in the flask under stirring. After the dropping, the flask was heated to 30° C. and stirred for 30 minutes, thereby obtaining a black liquid. Subsequently, 100 g of methanol was added to the resulting black liquid, stirring was stopped, and then left at rest for 1 hour. Then, a supernatant liquid was separated by decantation, and thus 18.0 g of a precipitate containing a silver particle was obtained.

Then, the average particle diameter of the resulting silver particle was measured with a transmission electron microscope (TEM) (H-7650, manufactured by Hitachi, Ltd.) and determined to be 55 nm. The standard deviation determined when the primary particle diameter of 100 randomly selected particles observed in a TEM image was measured was up to 20 nm, and formation of silver particles being monodisperse and uniform in particle diameter was confirmed.

Synthesis of Copper Particle

Synthesis Example 8

A flask, a reaction vessel, was charged with 32.3 g of 1-butanol, 46.2 g of 2-ethylhexylamine (2EHA), 3.2 g of oleic acid, and 18.3 g of anhydrous copper formate, which were then stirred under a nitrogen atmosphere until a homogeneous solution was formed. The solution was then heated to 100° C. in an oil bath and was stirred for 60 minutes. Thus, a black liquid was obtained.

Subsequently, after returning the resulting black liquid to the condition of room temperature, 100 g of methanol was added to the resulting black liquid. Then, a supernatant liquid was separated by decantation, and thus 10.2 g of a precipitate containing a copper particle was obtained.

Production of Composition for Forming a Conductive Film

In Example 1 to Example 17 and Comparative Example 1 to Comparative Example 8, the compositions for forming a conductive film of Example 1 to Example 17 and Comparative Example 1 to Comparative Example 8 were produced by the method described below using a metal salt or a metal particle of component (A), a metalloxane compound of component (B), and (C) an amine compound. Each of the produced compositions for forming a conductive film is called a composition for forming a copper film, a composition for forming a copper nickel film, or a composition for forming a silver film, depending upon the primary metal component of a conductive film to be formed using the composition.

Example 1

A composition for forming a copper film was produced by mixing 4.0 g of anhydrous copper formate, 0.1 g of PTI023 (tetra-n-butoxytitanium polycondensate (PDBT), produced by Gelest, Inc.) and 15.9 g of n-octylamine (OA) at room temperature with a wave rotor at 50 rpm.

Example 2

A composition for forming a copper film was produced in the same manner as in Example 1 except that 0.1 g of PTI023 of Example 1 was changed to 0.07 g of M-Silicate 51 (methyl polysilicate, produced by Tama Chemicals Co., Ltd.).

Example 3

A composition for forming a copper film was produced in the same manner as in Example 1 except that 0.1 g of PTI023 of Example 1 was changed to 0.07 g of Silicate 45 (ethyl polysilicate, produced by Tama Chemicals Co., Ltd.).

Example 4

A composition for forming a copper film was produced in the same manner as in Example 1 except that n-octylamine (OA) of Example 1 was changed to 2-ethylhexylamine (2EHA).

Example 5

A composition for forming a copper film was produced in the same manner as in Example 1 except that n-octylamine (OA) of Example 1 was changed to 3-ethoxypropylamine (3EPA).

Example 6

A composition for forming a copper film was produced in the same manner as in Example 1 except that 0.1 g of PTI023 of Example 1 was changed to 0.3 g of the above-mentioned PMPS solution of Synthesis Example 1.

Example 7

A composition for forming a copper film was produced in the same manner as in Example 1 except that PTI023 of Example 1 was changed to the above-mentioned viscous material contained a polytitanoxane isopropoxide (TTIP) of Synthesis Example 2.

Example 8

A composition for forming a copper film was produced in the same manner as in Example 1 except that PTI023 of Example 1 was changed to the above-mentioned viscous material contained a titanosiloxane polymer (TS) of Synthesis Example 3.

Example 9

A composition for forming a copper film was produced in the same manner as in Example 1 except that PTI023 of Example 1 was changed to the above-mentioned viscous material contained a zirconosiloxane polymer (ZS) of Synthesis Example 4.

Example 10

A composition for forming a copper film was produced in the same manner as in Example 1 except that PTI023 of Example 1 was changed to the above-mentioned viscous material contained a di-i-propoxybis(acetylacetonato)titanium condensate (PAT) of Synthesis Example 5.

Example 11

A composition for forming a copper film was produced in the same manner as in Example 1 except that 4.0 g of anhydrous copper formate of Example 1 was changed to 5.0 g of copper formate tetrahydrate.

Example 12

A composition for forming a silver film was produced by mixing 5.0 g of silver formate, 2.5 g of butylamine (BA), 0.1 g of PTI023 and 12.0 g of butanol at room temperature with a wave rotor at 50 rpm.

Example 13

A composition for forming a copper nickel film was produced by mixing 4.0 g of anhydrous copper formate, 1.0 g of nickel formate dehydrate 0.1 g of PTI023 and 15.9 g of n-octylamine (OA) at room temperature with a wave rotor at 50 rpm.

Example 14

A composition for forming a silver film in the form of a paste was produced by adding 0.8 g of terpineol and 0.2 g of PTI023 to 5.0 g of a precipitate containing the silver particle of Synthesis Example 7 described above.

Example 15

A composition for forming a copper film in the form of a paste was produced by adding 2.7 g of Solsperse J180 (produced by Lubrizol Corp.) and 0.3 g of PTI023 to 7.0 g of a precipitate containing the copper particle of Synthesis Example 8 described above.

Example 16

A composition for forming a copper film was produced by mixing 3.5 g of copper hydroxide, 0.1 g of PTI023, 10.7 g of 3-ethoxypropylamine and 3.2 g of formic acid at room temperature with a wave rotor at 50 rpm.

Example 17

A composition for forming a copper film was produced by mixing 4.2 g of copper acetate, 0.1 g of PTI023 (tetra-n-butoxytitanium polycondensate (PDBT), produced by Gelest, Inc.), 10.5 g of 3-ethoxypropylamine and 3.3 g of formic acid at room temperature with a wave rotor at 50 rpm.

Comparative Example 1

A composition for forming a copper film was produced by mixing 4.0 g of anhydrous copper formate, and 16.0 g of n-octylamine (OA) at room temperature with a wave rotor at 50 rpm.

Comparative Example 2

A composition for forming a copper film was produced in the same manner as in Comparative Example 1 except that n-octylamine (OA) of Comparative Example 1 was changed to 2-ethylhexylamine (2EHA).

Comparative Example 3

A composition for forming a copper film was produced in the same manner as in Comparative Example 1 except that n-octylamine (OA) of Comparative Example 1 was changed to 3-ethoxypropylamine (3EPA).

Comparative Example 4

A composition for forming a copper film was produced in the same manner as in Example 1 except that PTI023 of Example 1 was changed to tetra-n-butoxy titanium (TBT).

Comparative Example 5

A composition for forming a copper film was produced in the same manner as in Example 1 except that 0.1 g of PTI023 of Example 1 was changed to 0.07 g of methyltrimethoxysilane (MTMS).

Comparative Example 6

A composition for forming a copper film was produced in the same manner as in Example 1 except that PTI023 of Example 1 was changed to tetra-n-butoxy zirconium (TBZR).

Comparative Example 7

A composition for forming a copper film was produced in the same manner as in Example 1 except that PTI023 of Example 1 was changed to XER-32 (metal-free NBR (NBR), produced by JSR Corp.) and n-octylamine (OA) of Example 1 was changed to 3-ethoxypropylamine (3EPA).

Comparative Example 8

A composition for forming a copper film was produced in the same manner as in Example 1 except that PTI023 of Example 1 was changed to L-SBR-820 (liquid SBR (SBR), produced by KURARAY Co., Ltd.).

Forming of a Conductive Film

Copper films, copper nickel films, and silver films were produced using the compositions for forming a conductive film prepared in Example 1 to Example 17 and Comparative Example 1 to Comparative Example 8.

Example 18: Forming of a Copper Film and a Copper Nickel Film

Using each of the compositions for forming a copper film of Examples 1 to 11, Examples 16 to 17, and Comparative Examples 1 to 8 and the composition for forming a copper nickel film of Example 13, a coating layer being 50 mm on each side and 100 µm in thickness was formed with a bar coater on an alkali-free glass substrate in a square shape being 90 mm in length and 90 mm in width, which was a substrate. Next, the glass substrates on which the coating film described above had been formed were subjected to heat treatment at 180° C. for 10 minutes under a nitrogen atmosphere by using a hot plate, and thus patterned thin films being 0.5 µm to 1.5 µm in thickness were obtained.

Moreover, a patterned thin film was obtained in the same manner as that described above except that the composition for forming a copper film of Example 15 was used and the heating temperature was 250° C.

Example 19: Forming of a Silver Film

Using each of the compositions for forming a silver film of Examples 12 and 14, a coating layer being 50 mm on each side and 100 µm in thickness was formed with a bar coater on an alkali-free glass substrate in a square shape being 90 mm in length and 90 mm in width, which was a substrate. Next, the glass substrates on which the coating film described above had been formed were subjected to heat treatment at 180° C. for 10 minutes under an air atmosphere by using a hot plate, and thus patterned thin films being 0.5 µm to 1.5 µm in thickness were obtained.

Evaluation

Example 20: Evaluation of Resistance Property

Using the thin films formed using the compositions for forming a conductive film (the compositions for forming a copper film, the compositions for forming a copper nickel film, and the composition for forming a silver film) of Examples 1 to 17 and Comparative Examples 1 to 8 in accordance with the same methods as those in Examples 18 and 19, their volume resistance values were evaluated as evaluation of resistance property.

Example 21: Evaluation of Adhesion Property (Adhesion Test)

Using the thin films formed using the compositions for forming a conductive film (the compositions for forming a copper film, the compositions for forming a copper nickel film, and the composition for forming a silver film) of Examples 1 to 17 and Comparative Examples 1 to 8 in accordance with the same methods as those in Examples 18 and 19, an adhesion test was conducted in order to evaluate adhesion to a substrate.

The adhesion test complied with a tape testing method described in JIS-H-8504. Evaluations are the following three grades:

A: No conductive film was attached to the adhesive surface of the tape
B: Some part of the conductive film was attached to the adhesive surface of the tape
C: The Entire part of the conductive film was attached to the adhesive surface of the tape The measurement results of an individual volume resistance value are collectively shown in Table 1 together with the main components of the compositions for forming a conductive film of Examples 1 to 17 and Comparative Examples 1 to 8 used for the formation of thin films for evaluation.

Example 22: Thermal Shock Test

Using the thin films formed using the compositions for forming a conductive film (the compositions for forming a copper film, the compositions for forming a copper nickel film, and the composition for forming a silver film) of Examples 1 to 17 and Comparative Examples 1 to 8 in accordance with the same methods as those in Examples 18 and 19, the film was installed in a thermal shock tester (TSA-72EH-W, manufactured by Espec Corp.) and was exposed to an environment of (−55° C. to 85° C.) by 100 cycles in the air. The sheet resistance values before and after the exposure were measured with the four-terminal resistance measurement apparatus. A sample with a resistance value increase ratio of up to 20% was evaluated as A, one with a resistance value increase ratio of 20% to 100% as B, and one with a resistance value increase ratio of 100% or more as C. The evaluated results are summarized in Table 1. The thin films formed using the compositions for forming a copper film of Comparative Examples 7 to 8 were in a poor state of film, for example, delamination occurred after the exposure to that environment, and therefore their sheet resistance values were not able to be measured.

Example 23: Temperature and Humidity Controlled Test

Using the thin films formed using the compositions for forming a conductive film (the compositions for forming a copper film, the compositions for forming a copper nickel film, and the composition for forming a silver film) of Examples 1 to 17 and Comparative Examples 1 to 8 in accordance with the same methods as those in Examples 18 and 19, the film was installed in a constant temperature and humidity apparatus (PR-3J, manufactured by Espec Corp.) and was exposed to an environment of (85° C., 85%) for 1000 hours in the air. The sheet resistance values before and after the exposure were measured with the four-terminal resistance measurement apparatus. A sample with a resistance value increase ratio of up to 20% was evaluated as A, one with a resistance value increase ratio of 20% to 100% as B, and one with a resistance value increase ratio of 100% or more as C. The evaluated results are summarized in Table 1. The thin films formed using the compositions for forming a copper film of Comparative Examples 7 to 8 were in a poor state of film, for example, delamination occurred after the exposure to that environment, and therefore their sheet resistance values were not able to be measured.

As shown in Table 1, it was revealed that the conductive films of Examples 1 to 17 were excellent in adhesion to a substrate and high reliability. It was also revealed that the conductive films of Comparative Examples 1 to 8 had low adhesion to a substrate and poor reliability.

The evaluated results described above showed that the conductive films (copper films, copper nickel films, and silver films) formed using the compositions for forming a conductive film of Examples 1 to 17 had excellent resistance properties, excellent adhesion to a substrate, and high reliability in combination.

TABLE 1

| | Composition for Forming a Conductive Film | | | Evaluated Results | | | |
|---|---|---|---|---|---|---|---|
| | (A) Metal Salt or Metal Particle | (B) Metalloxane compound | (C) Amine Compound | Volume Resistivity ($\mu\Omega \cdot cm$) | Adhesion Test | Thermal Shock Test | Temperature and Humidity Controlled Test |
| Example 1 | Anhydrous copper formate | Tetra-n-butoxytitanium polycondensate | n-octylamine | 30 | A | A | A |
| Example 2 | Anhydrous copper formate | Methyl polysilicate | n-octylamine | 80 | A | A | B |
| Example 3 | Anhydrous copper formate | Ethyl polysilicate | n-octylamine | 90 | A | A | B |
| Example 4 | Anhydrous copper formate | Tetra-n-butoxytitanium polycondensate | 2-ethylhexyl amine | 25 | A | A | A |
| Example 5 | Anhydrous copper formate | Tetra-n-butoxytitanium polycondensate | 3-ethoxy-propyl amine | 35 | A | A | A |
| Example 6 | Anhydrous copper formate | Methyl trimethoxysilane/ Phenyl trimethoxysilane polycondensates | n-octylamine | 35 | A | A | A |
| Example 7 | Anhydrous copper formate | Titanium tetraisopropoxide polycondensate | n-octylamine | 50 | A | A | A |
| Example 8 | Anhydrous copper formate | Titanosiloxane polymer | n-octylamine | 55 | A | A | A |
| Example 9 | Anhydrous copper formate | Zirconosiloxane polymer | n-octylamine | 45 | A | A | A |
| Example 10 | Anhydrous copper formate | Di-i-propoxybis(acetyl-acetonato)titanium condensate | n-octylamine | 40 | A | A | A |
| Example 11 | Copper formate tetrahydrate | Tetra-n-butoxytitanium polycondensate | n-octylamine | 33 | A | A | A |
| Example 12 | Silver formate | Tetra-n-butoxytitanium polycondensate | Butylamine | 300 | A | A | A |
| Example 13 | Anhydrous copper formate/ Nickel formate dihydrate | Tetra-n-butoxytitanium polycondensate | n-octylamine | 400 | A | A | B |
| Example 14 | Silver particle | Tetra-n-butoxytitanium polycondensate | — | 50 | B | A | A |
| Example 15 | Copper particle | Tetra-n-butoxytitanium polycondensate | — | 30 | A | A | A |
| Example 16 | Copper hydroxide | Tetra-n-butoxytitanium polycondensate | 3-ethoxy-propyl amine | 60 | A | A | A |
| Example 17 | Copper acetate | Tetra-n-butoxytitanium polycondensate | 3-ethoxy-propyl amine | 180 | A | A | A |
| Comparative Example 1 | Anhydrous copper formate | — | n-octylamine | 20 | C | B | C |
| Comparative Example 2 | Anhydrous copper formate | — | 2-ethylhexyl amine | 10 | C | B | C |
| Comparative Example 3 | Anhydrous copper formate | — | 3-ethoxy-propyl amine | 15 | C | B | C |
| Comparative Example 4 | Anhydrous copper formate | Tetra-n-butoxytitanium | n-octylamine | 30 | C | C | C |
| Comparative Example 5 | Anhydrous copper formate | Methyl trimethoxysilane | n-octylamine | 35 | C | C | C |
| Comparative Example 6 | Anhydrous copper formate | Tetra-n-butoxyzirconium | n-octylamine | 30 | C | C | C |
| Comparative Example 7 | Anhydrous copper formate | Nitrile-butadiene rubber | 3-ethoxy-propyl amine | >1000 | C | NA | NA |
| Comparative Example 8 | Anhydrous copper formate | Styrene-butadiene rubber | n-octylamine | >1000 | C | NA | NA |

Embodiments of the present invention are described above, but the present invention is not limited to the embodiments described above and certain changes may be made in carrying out the present invention without departing from the spirit and scope of the invention.

INDUSTRIAL APPLICABILITY

The composition for forming a conductive film of the present invention can be suitably used as a composition for forming a conductive pattern of a circuit board in the electronics field. In addition, the conductive film of the present invention can be used for the production of electronic parts and the like in the electronics field, etc. For example, the conductive film of the present invention can be used for the production of wiring, circuit boards, antennas, sensors, computing elements, and display elements.

What is claimed is:

1. A composition for forming a conductive film, the composition comprising:
   a metal salt (A1) and, optionally, a metal particle (A2) as a component (A) that serves as a metal source of the conductive film, wherein the metal particle (A2) comprise at least one metal selected from the group consisting of Ni, Pd, Pt, Cu, Ag, and Au;
   wherein the metal salt (A1) is a carboxylate comprising a metal selected from the group consisting of Cu, Ag, and Ni; and
   a metalloxane compound (B) having at least one metal atom selected from the group consisting of Ti, Zr, Sn, Si, and Al in its main chain.

2. The composition for forming a conductive film according to claim 1, wherein the carboxylate is at least one selected from the group consisting of copper formate, silver formate, and nickel formate.

3. The composition for forming a conductive film according to claim 1, wherein the composition comprises the metal particle (A2) that has an average particle diameter of from 5 nm to 100 nm and comprises a metal selected from the group consisting of Cu, Ag, and Ni.

4. The composition for forming a conductive film according to claim 1, wherein the content of the component (B) is from 20% by mass to 80% by mass relative to 100% by mass in total of the masses of the component (A) and the component (B).

5. The composition for forming a conductive film according to claim 1, further comprising (C) an amine compound.

6. A method for producing a plating film, the method comprising:
   forming a conductive film from a composition comprising:
      a metal salt (A1) and, optionally, a metal particle (A2) as a component (A) that serves as a metal source of the conductive film, wherein the metal particle (A2) comprises at least one metal selected from the group consisting of Ni, Pd, Pt, Cu, Ag, and Au;
      wherein the metal salt (A1) is a carboxylate comprising a metal selected from the group consisting of Cu, Ag, and Ni; and
      a metalloxane compound (B) having at least one metal atom selected from the group consisting of Ti, Zr, Sn, Si, and Al in its main chain; and
   producing a plating film by plating the conductive film.

7. The method for producing a plating film according to claim 6, wherein the carboxylate is at least one selected from the group consisting of copper formate, silver formate, and nickel formate.

* * * * *